(12) United States Patent
Chen et al.

(10) Patent No.: US 12,334,519 B2
(45) Date of Patent: Jun. 17, 2025

(54) BATTERY AND AUTOMOTIVE DIAGNOSTIC TABLET

(71) Applicant: AUTEL INTELLIGENT TECHNOLOGY CORP., LTD., Guangdong (CN)

(72) Inventors: Huaming Chen, Guangdong (CN); Weikang Wang, Guangdong (CN); Honghua Lu, Guangdong (CN)

(73) Assignee: AUTEL INTELLIGENT TECHNOLOGY CORP., LTD., Shenzhen (CN)

( * ) Notice: Subject to any disclaimer, the term of this patent is extended or adjusted under 35 U.S.C. 154(b) by 613 days.

(21) Appl. No.: 17/656,471

(22) Filed: Mar. 25, 2022

(65) Prior Publication Data

US 2022/0216528 A1    Jul. 7, 2022

Related U.S. Application Data

(63) Continuation of application No. PCT/CN2020/118154, filed on Sep. 27, 2020.

(30) Foreign Application Priority Data

Sep. 30, 2019   (CN) .......................... 201910940281.1

(51) Int. Cl.
*H02J 7/00*   (2006.01)
*G01R 31/3842*   (2019.01)
(Continued)

(52) U.S. Cl.
CPC .... *H01M 10/4257* (2013.01); *G01R 31/3842* (2019.01); *G01R 31/396* (2019.01);
(Continued)

(58) Field of Classification Search
USPC .................................................. 320/134–136
See application file for complete search history.

(56) References Cited

U.S. PATENT DOCUMENTS

| 7,550,947 B2* | 6/2009 | Sakurai | H01M 10/48 |
| | | | 320/134 |
| 8,183,835 B2* | 5/2012 | Takeda | H01M 50/574 |
| | | | 320/135 |

(Continued)

FOREIGN PATENT DOCUMENTS

| CN | 202121027 U | 1/2012 |
| CN | 103532104 A | 1/2014 |

(Continued)

OTHER PUBLICATIONS

First office action of CN patent application No. 201910940281.1 issued on Mar. 22, 2024.

(Continued)

*Primary Examiner* — Samuel Berhanu
(74) *Attorney, Agent, or Firm* — Andrew C. Cheng

(57) ABSTRACT

The present application provides a battery that has application in automotive diagnostic tablets. The battery includes a battery cell, a positive electrode interface, and a negative electrode interface. The positive electrode of the battery cell is connected to the positive electrode interface. The battery further includes a first resistor and a protection chip. A first end of the first resistor is connected to the negative electrode of the battery cell, and the other end of the first resistor is connected to the negative electrode interface. The protection chip includes a power detection end and a communication interface, and the power detection end is connected to the first resistor. The protection chip is used to detect the power information of the battery cell by means of the power (Continued)

detection end, and the power information is sent by means of the communication interface to a microprocessor.

12 Claims, 2 Drawing Sheets

(51) Int. Cl.
*G01R 31/396* (2019.01)
*H01M 10/42* (2006.01)
(52) U.S. Cl.
CPC ............ *H01M 2010/4271* (2013.01); *H01M 2010/4278* (2013.01)

(56) References Cited

U.S. PATENT DOCUMENTS

| | | | | |
|---|---|---|---|---|
| 8,716,980 | B2* | 5/2014 | Lim | H02J 7/0031 |
| | | | | 320/140 |
| 9,759,778 | B2 | 9/2017 | Nagato | |
| 10,790,679 | B2* | 9/2020 | Motoichi | H02J 7/04 |
| 2015/0134981 | A1 | 5/2015 | Nagato | |
| 2017/0370994 | A1 | 12/2017 | Nagato | |
| 2018/0226816 | A1 | 8/2018 | Na | |

FOREIGN PATENT DOCUMENTS

| | | |
|---|---|---|
| CN | 203491749 U | 3/2014 |
| CN | 204258355 U | 4/2015 |
| CN | 104935024 A | 9/2015 |
| CN | 104993459 A | 10/2015 |
| CN | 205304225 U | 6/2016 |
| CN | 107017670 A | 8/2017 |
| CN | 206533156 U | 9/2017 |
| CN | 107231015 A | 10/2017 |
| CN | 107834670 A | 3/2018 |
| CN | 207354057 U | 5/2018 |
| CN | 207664662 U | 7/2018 |
| CN | 207801465 U | 8/2018 |
| CN | 208316322 U | 1/2019 |
| CN | 209402441 U | 9/2019 |
| CN | 110571487 A | 12/2019 |
| CN | 210744088 U | 6/2020 |
| CN | 210957773 U | 7/2020 |
| JP | 2015094742 A | 5/2015 |
| JP | 6298616 B2 | 3/2018 |

OTHER PUBLICATIONS

Search report of CN patent application No. 201910940281.1 issued on Mar. 22, 2024.
International search report of PCT/CN2020/118154 mailed Dec. 29, 2020.
Texas Instruments "BQ28Z610 Impedance Track™ Gas Gauge and Protection Solution for 1-Series to 2-Series Cell Li-Ion Battery Packs", pp. 1-29.

\* cited by examiner

BATTERY AND AUTOMOTIVE DIAGNOSTIC TABLET

CROSS-REFERENCE TO RELATED APPLICATIONS

The present application is continuation application of International Application No. PCT/CN2020/118154, filed on Sep. 27, 2020, which claims the priority to the Chinese patent application No. 201910940281.1 entitled "battery and automotive diagnostic tablet" filed on Sep. 30, 2019, which are incorporated herein by reference in its entirety.

TECHNICAL FIELD

The present application relates to the technical field of automobiles, and in particular to a battery and an automotive diagnostic tablet.

BACKGROUND

With the popularization of automotive diagnostic technology and the maturity of battery management technology, the integrated development of automotive diagnosis is promoted. In the application era of function-intensive products, more and more diagnostic products have increasingly higher integration and increasingly higher current. The improvement of battery charging and discharging current requiring high battery endurance and accurate non jump of the voltameter is a relatively concerning problem for the automotive diagnostic personnel in the process of automotive diagnosis.

At present, in a battery of a diagnostic tablet, a voltameter chip is usually placed at the main board end of the diagnostic tablet together with a charging chip, and is electrically connected to the battery via a battery connector; the voltameter chip needs to detect the voltage and current state of the charging chip to judge the power state of the battery; since an internal resistance introduced via a connector, a wire, and a PCB trace is required in the middle, a voltage drop will inevitably occur; the greater the current, the greater the voltage drop, which will lead to a great error between a detection value of the power of a battery cell by the voltameter chip and the actual state of the battery cell.

SUMMARY OF THE DISCLOSURE

In view of the above defects in the prior art, it is an object of embodiments of the present application to provide a battery and an automotive diagnostic tablet having a small power detection error.

The object of the embodiments of the present application is achieved by the following technical solutions.

In order to solve the above technical problem, in the first aspect, an embodiment of the present application provides a battery. The battery comprises a battery cell, a negative electrode interface, and a positive electrode interface, the positive electrode of the battery cell being connected to the positive electrode interface. The battery further comprises:

a first resistor, wherein one end of the first resistor is connected to the negative electrode of the battery cell, and the other end of the first resistor is connected to the negative electrode interface; and a protection chip comprising a power detection end and a communication interface, wherein the power detection end is connected to the first resistor, and the protection chip is configured to detect power information of the battery cell via the power detection end, and sending the power information to a microprocessor via the communication interface.

In some embodiments, the battery further comprises a switching circuit;

an input end of the switching circuit is connected to the positive electrode of the battery cell, and an output end of the switching circuit is connected to the positive electrode interface;

the protection chip is further provided with a positive electrode voltage end, a negative electrode voltage end, and an execution end; the execution end of the protection chip is connected to a control end of the switching circuit; the positive electrode voltage end and the negative electrode voltage end are respectively connected to the positive electrode of the battery cell and the negative electrode of the battery cell;

when it is detected that a voltage of the battery cell is higher than a first preset voltage, the protection chip controls the switching circuit to be in a first state via the execution end, wherein when the switching circuit is in the first state, current of the the switching circuit cannot flow from the positive electrode interface to the battery cell, but the current of the the switching circuit can flow from the battery cell to the positive electrode interface;

when it is detected that the voltage of the battery cell is lower than a second preset voltage, the protection chip controls the switching circuit to be in a second state via the execution end, wherein when the switching circuit is in the second state, the current can flow from the positive electrode interface to the battery cell, but the current cannot flow from the battery cell to the positive electrode interface.

In some embodiments, the protection chip is further provided with a current detection end;

the current detection end is connected to a link between the switching circuit and the positive electrode interface, and the protection chip is configured to control the switching circuit to be in the second state via the execution end when the current detection end detects that the current of the the switching circuit is greater than a preset current.

In some embodiments, the switching circuit comprises a first switch tube and a second switch tube, a source electrode of the first switch tube is connected to the positive electrode of the battery cell, a drain electrode of the first switch tube is connected to the drain electrode of the second switch tube, the source electrode of the second switch tube is connected to the positive electrode interface, the first switch tube and the second switch tube both have a body diode, the body diode of the first switch tube enables the current of the the switching circuit to flow from the battery cell in a direction of the positive electrode interface, and the body diode of the second switch tube enables the current of the the switching circuit to flow from the positive electrode interface in the direction of the battery cell;

the execution end of the protection chip comprises a charging protection execution end and a discharging protection execution end, the charging protection execution end being connected to a gate of the first switch tube, and the discharging protection execution end being connected to the gate of the second switch tube.

In some embodiments, both the first switch tube and the second switch tube are N-metal oxide semiconductor (NMOS) tubes.

In some embodiments, the protection chip is further provided with a resistance detection end;

the resistance detection end is connected to a thermistor in the battery cell;

the protection chip is configured to detect a resistance value of the thermistor in the battery cell via the resistance detection end, and control the switching circuit to switch off when a detected resistance value is not within a preset resistance value range.

In some embodiments, the power detection end comprises a charged power detection end and a discharged power detection end;

the charged power detection end is connected to the negative electrode of the battery cell and a link of the first resistor, and the discharged power detection end is connected to the first resistor and the link of the negative electrode interface.

In some embodiments, the battery further comprises a first capacitor in parallel with the first resistor.

In some embodiments, the communication interface is an inter integrated circuit (I2C) interface.

In order to solve the above technical problem, according to the second aspect, the embodiments of the present application provide an automotive diagnostic tablet. The automotive diagnostic tablet comprises amicro controller unit (MCU), a charging chip, and the above-mentioned battery, wherein the MCU is communicatively connected to the charging chip and the communication interface of the battery respectively, and the charging chip is electrically connected to the battery.

Compared with the prior art, the advantageous effects of the present application are as follows. Unlike the prior art, embodiments of the present application provide a battery that has application in automotive diagnostic tablets. The battery comprises a battery cell, a positive electrode interface, and a negative electrode interface, the positive electrode of the battery cell being connected to the positive electrode interface. The battery also comprises a first resistor and a protection chip. One end of the first resistor is connected to the negative electrode of the battery cell, and the other end of the first resistor is connected to the negative electrode interface. The protection chip comprises a power detection end and a communication interface, and the power detection end is connected to the first resistor. The protection chip is used to detect the power information of the battery cell by means of the power detection end, and the power information is sent by means of the communication interface to a microprocessor. The battery according to the embodiment of the present application combines the functions of power detection and battery cell protection, and, by means of a protection chip, is capable of directly detecting the power state of a battery cell with small detection errors.

BRIEF DESCRIPTION OF THE DRAWINGS

One or more embodiments are illustrated by way of examples with the figures in the corresponding drawings. The illustrative examples are not to be construed as limiting the embodiments. Elements/modules and steps in the drawings having the same reference numeral designations represent like elements/modules and steps, and the figures in the accompanying drawings are not to scale unless specifically stated.

DETAILED DESCRIPTION OF THE DISCLOSURE

Hereinafter, the present application will be described in detail with reference to specific embodiments. The following embodiments will aid those skilled in the art in further understanding the present application, but do not limit the present application in any form. It should be noted that several variations and improvements can be made by a person of ordinary skills in the art without departing from the inventive concept. These are all within the scope of the present application.

In order that the object, technical solution, and advantages of the present application may be more clearly understood, the present application will now be described in further detail with reference to the accompanying drawings and embodiments. It should be understood that the particular embodiments described herein are illustrative only and are not restrictive to the present application.

It should be noted that various features of the embodiments of the present application can be combined with each other without conflict within the scope of the present application. In addition, although the functional module division is made in the device schematic diagram, in some cases, it may be different from the module division in the device. Furthermore, the words "first", "second", "third", and the like, as used herein do not limit the order of the data and execution, but merely distinguish between identical or similar items that perform substantially the same function and role.

Unless defined otherwise, all technical and scientific terms used in the description have the same meaning as commonly understood by one of ordinary skill in the art to which this application belongs. The terms used in the description of the present application are for the purpose of describing specific implementation modes only and are not intended to be limiting of the present application. As used in the description, the term "and/or" includes any and all combinations of one or more of the associated listed items.

Furthermore, the technical features involved in various implementation modes of the present application described below can be combined as long as they do not conflict with each other.

Specifically, embodiments of the present application will be further described with reference to the accompanying drawings.

Figure 1:
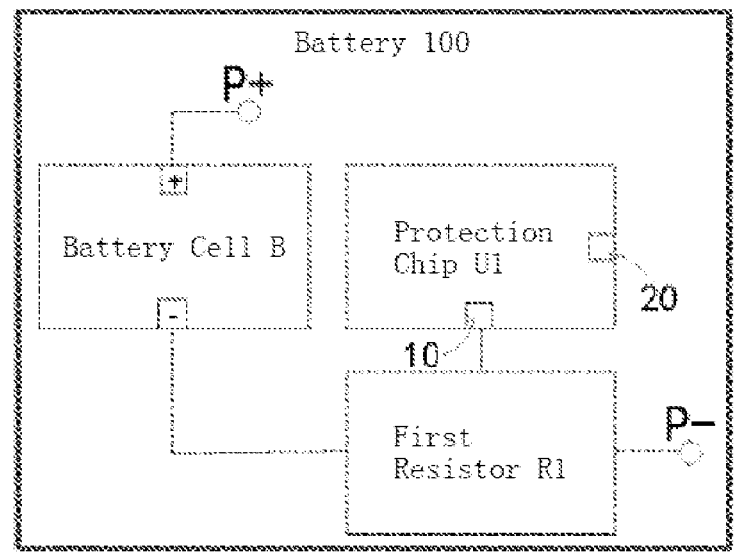
FIG. 1 is a block diagram of a circuit principle of a battery according to an embodiment of the present application.

An embodiment of the present application provides a battery. Referring to FIG. 1, which shows a block diagram of a circuit principle of a battery 100, the battery 100 comprises a battery cell B, a negative electrode interface P−, and a positive electrode interface P+. The positive electrode of the battery cell B is connected to the positive electrode interface P+. The battery 100 further comprises a first resistor R1 and a protection chip U1.

One end of the first resistor R1 is connected to the negative electrode of the battery cell B, and the other end is connected to the negative electrode interface P−. The protection chip U1 comprises a power detection end 10 and a communication interface 20. The power detection end 10 is connected to the first resistor R1. The protection chip U1 is configured to detect power information of the battery cell B via the power detection end 10, and send the power information to a microprocessor via the communication interface 20.

In an embodiment of the present application, the battery 100 is suitable for the use in all diagnostic instruments or diagnostic tablets with batteries; the microprocessor refers to a microprocessor within a diagnostic instrument or a diagnostic tablet, such as a TPMS diagnostic tool, an endoscopic diagnostic tool, an anti-theft product detection tool, a battery detection tool, an infrared thermal imaging detection tool, a four-wheel aligner detection tool, etc.

In addition, the positive electrode interface P+ and the negative electrode interface P− are configured to connect a load or a charger. Under the condition that the battery 100 is in normal operation, when the positive electrode interface P+ and the negative electrode interface P− are connected to a load, the battery 100 is in a discharging state and supplies power for the load; when the positive electrode interface P+ and the negative electrode interface P− are connected to a charger, the battery 100 is in a charged state, and the charger supplies power to the battery 100.

An embodiment of the present application provides a battery that has application in automotive diagnostic tablets. The battery comprises a battery cell, a positive electrode interface, and a negative electrode interface. The positive electrode of the battery cell is connected to the positive electrode interface. The battery futher comprises a first resistor and a protection chip. One end of the first resistor is connected to the negative electrode of the battery cell, and the other end of the first resistor is connected to the negative electrode interface. The protection chip comprises a power detection end and a communication interface, and the power detection end is connected to the first resistor. The protection chip is configured to detect the power information of the battery cell by means of the power detection end, and the power information is sent by means of the communication interface to a microprocessor. The battery according to the embodiment of the present application combines the functions of power detection and battery cell protection, and, by means of a protection chip, is capable of directly detecting the power state of a battery cell with small detection errors.

Figure 2:
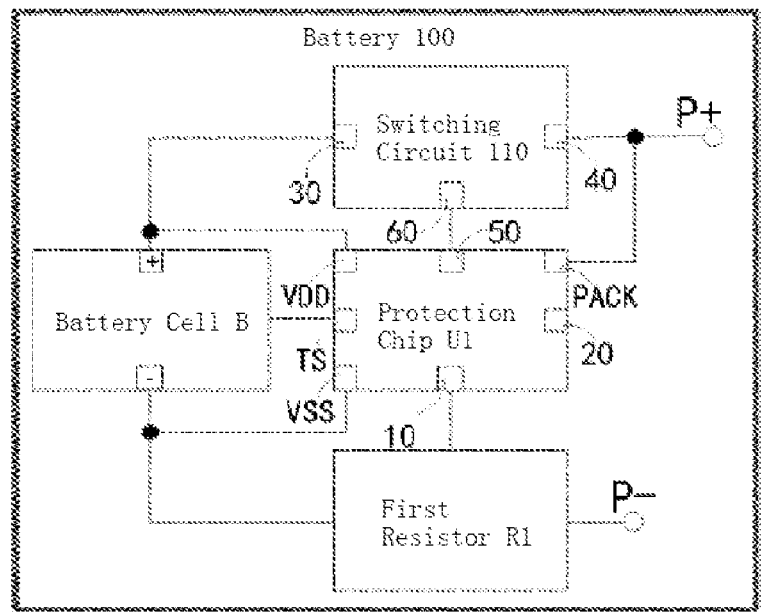
FIG. 2 is a block diagram of a circuit principle of another battery according to an embodiment of the present application.

In some embodiments, reference is made to FIG. 2, which shows a block diagram of a circuit principle of another battery 100. The battery 100 further comprises a switching circuit 110.

The input end 30 of the switching circuit 110 is connected to the positive electrode of the battery cell B, and the output end 40 of the switching circuit 110 is connected to the positive electrode interface P+. The protection chip U1 is further provided with a positive electrode voltage end VDD, a negative electrode voltage end VSS, and an execution end 50; the execution end 50 of the protection chip U1 is connected to the control end 60 of the switching circuit 110; the positive electrode voltage end VDD and the negative electrode voltage end VSS are respectively connected to the positive electrode of the battery cell B and the negative electrode of the battery cell B.

When it is detected that the voltage of the battery cell B is higher than a first preset voltage, the protection chip U1 controls the switching circuit 110 to be in a first state via the execution end 50. When the switching circuit 110 is in the first state, the current of the switching circuit 110 cannot flow from the positive electrode interface P+ to the battery cell B, but the current of the switching circuit 110 can flow from the battery cell B to the positive electrode interface P+. That is, the battery cell B is in a dischargeable, but non-chargeable state.

When it is detected that the voltage of the battery cell B is lower than a second preset voltage, the protection chip U1 controls the switching circuit 110 to be in a second state via the execution end U1. When the switching circuit 110 is in the second state, the current of the switching circuit 110 can flow from the positive electrode interface P+ to the battery cell B, but the current of the switching circuit 110 cannot flow from the battery cell B to the positive electrode interface P+. That is, the battery cell B is in a chargeable but non-dischargeable state.

With continued reference to FIG. 2, the protection chip U1 is further provided with a current detection end PACK, the current detection end PACK is connected to a link between the switching circuit 110 and the positive electrode interface P+, and the protection chip U1 is configured to control the switching circuit 110 to be in the second state via the execution end 50 when the current detection end PACK detects that the current of the switching circuit 110 is greater than the preset current. That is, the battery cell B is in a chargeable but non-dischargeable state.

With continued reference to FIG. 2, the protection chip U1 is further provided with a resistance detection end TS. The resistance detection end TS is connected to a thermistor (not shown) in the battery cell B. The protection chip U1 is configured to detect the resistance value of the thermistor in the battery cell B via the resistance detection end TS, and control the switching circuit 110 to be switched off when the detected resistance value is not within a preset resistance value range.

Figure 3:
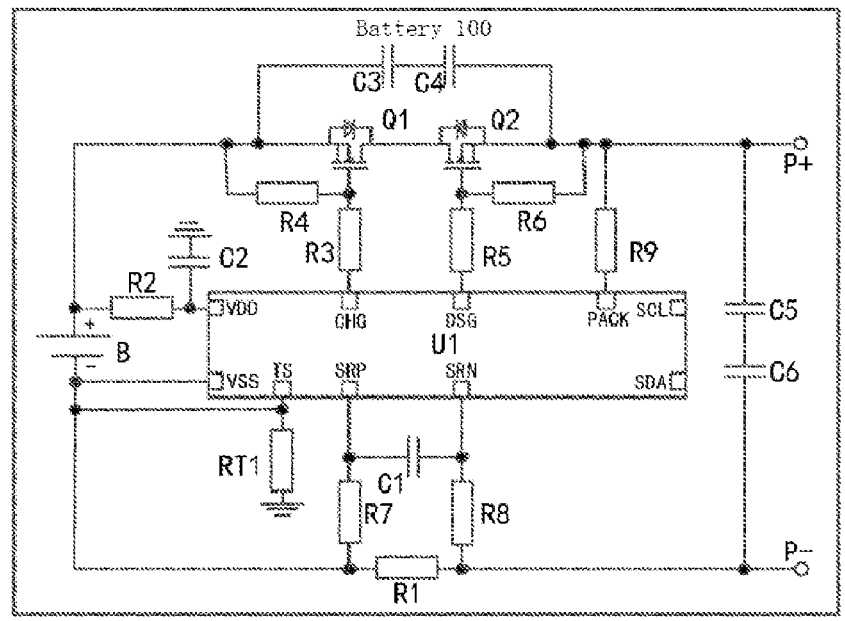
FIG. 3 is a schematic diagram of a circuit structure of a battery according to an embodiment of the present application.

In some embodiments, reference is made to FIG. 3, which shows a schematic diagram of a circuit structure of the battery 100 as shown in FIG. 2. The embodiment of the present application takes one battery cell as an example, and it needs to be noted that the battery cell B may be one or more in number according to different application scenarios, and the number of the battery cells is not limited in the present application.

Specifically, the power detection end 10 comprises a charged power detection end SRP and a discharged power detection end SRN. The charged power detection end SRP is connected to the link between the negative electrode of the battery cell B and the first resistor R1, and the discharged power detection end SRN is connected to the link between the first resistor R1 and the negative electrode interface P−.

In the embodiment of the present application, the current and direction flowing through the first resistor R1 can be detected through the charged power detection end SRP and the discharged power detection end SRN so as to count the total amount of charged charge or discharged charge, so that the charging chip U1 can realize the function of a voltameter.

Specifically, when it is detected that the voltage value of the charged power detection end SRP is lower than the voltage value of the discharged power detection end SRN, the battery 100 is in a charging state. The power is supplied to the battery 100 through an external charger, at this moment, the voltage drop between the charged power detection end SRP and the discharged power detection end SRN is acquired, and in combination with the resistance value of the first resistor R1, the power information of the charging of the battery 100 can be calculated and obtained.

When it is detected that the voltage value of the charged power detection end SRP is higher than the voltage value of the discharged power detection end SRN, the battery 100 is in a discharging state. The battery 100 supplies power for an external load, at this moment, the voltage drop between the charged power detection end SRP and the discharged power detection end SRN is acquired, and in combination with the resistance value of the first resistor R1, the power information of the discharging of the battery 100 can be calculated and obtained.

In some embodiments, with continued reference to FIG. 3, the battery 100 further includes a first capacitor C1 in parallel with the first resistor R1. The first capacitor C1 is a filter capacitor, the capacitance value of the first capacitor C1 is 0.1 microfarads, and the resistance value of the first resistor R1 is 0.001 ohm.

The communication interface 20 is an inter integrated circuit (I2C) interface, the communication interface 20 comprises an SCL communication port and an SDA communication port, and the protection chip U1 is electrically connected to the charging chip via the SCL communication port and the SDA communication port, and is communicatively connected to the microprocessor via the SCL communication port and the SDA communication port.

With continued reference to FIG. 3, the switching circuit 110 comprises a first switch tube Q1 and a second switch tube Q2. The source electrode of the first switch tube Q1 is connected to the positive electrode of the battery cell B, the drain electrode of the first switch tube Q1 is connected to the drain electrode of the second switch tube Q2, the source electrode of the second switch tube Q2 is connected to the positive electrode interface P+, and the first switch tube Q1 and the second switch tube Q2 both have a body diode. The body diode of the first switch tube Q1 enablesthe current of the switching circuit 110 to flow from the battery cell B in the direction of the positive electrode interface P+, and the body diode of the second switch tube Q2 enables the current of the switching circuit 110 to flow from the positive electrode interface P+ in the direction of the battery cell B. The first switch tube Q1 and the second switch tube Q2 are both N-metal oxide semiconductor (NMOS) tubes.

The execution end 50 of the protection chip U1 comprises a charging protection execution end CHG and a discharging protection execution end DSG. The charging protection execution end CHG is connected to the gate of the first switch tube Q1, and the discharging protection execution end DSG is connected to the gate of the second switch tube Q2.

In an embodiment of the present application, when the battery 100 is normally charged or discharged, both the charging protection execution end CHG and the discharging protection execution end DSG of the protection chip U1 output a high level, and both the first switch tube Q1 and the second switch tube Q2 are in a conductive state. Furthermore, the first preset voltage is 4.4V, and the second preset voltage is 2.9V.

When it is detected through the positive electrode voltage end VDD and the negative electrode voltage end VSS that the voltage of the battery cell B is higher than 4.4V, the charging protection execution end CHG outputs a low level, and controls the first switch tube Q1 to turn off so as to cut off a charging loop, so that the external charger cannot charge the battery cell B, thereby playing the role of overcharge protection. At this time, the battery cell B can discharge the external load through the body diode due to the presence of the body diode of the first switch tube Q1. When the protection chip U1 detects that the voltage of the battery cell B is lower than 4.2V, the charging protection execution end CHG outputs a high level, the first switch tube Q1 returns to the conductive state again, and the charger can charge the battery cell B again. The overcharge protection time is very short, usually set within 3 s to avoid misjudgment due to interference.

When it is detected through the positive electrode voltage end VDD and the negative electrode voltage end VSS that the voltage of the battery cell B is lower than 2.9V, the discharging protection execution end DSG outputs a low level, and controls the second switch tube Q2 to turn off, so as to cut off the discharging loop, so that the battery cell B cannot discharge the external load, thereby playing the role of overdischarge protection. At this time, the charger can charge the battery cell B through the body diode due to the presence of the body diode of the second switch tube Q2. When a charging chip (not shown) electrically connected to the protection chip U1 detects that the voltage of the battery cell B is higher than 2.95V, the discharging protection execution end DSG outputs a high level, the second switch tube Q2 returns to the conductive state again, and the battery cell B can charge the external load again. The overdischarge protection time is very short, usually set within 3 s to avoid misjudgment due to interference.

With continued reference to FIG. 3, the battery 100 further includes a thermistor RT1. One end of the thermistor RT1 is respectively connected to the resistance detection end TS and a negative electrode of the battery cell B, and the other end of the thermistor RT1 is grounded.

Specifically, during the charging process, the temperature of the battery cell B will rise. When the resistance detection end TS detects that the resistance value of the thermistor RT1 is less than 4.8879 k ohms, it indicates that the temperature of the battery cell B is greater than 45 degrees, and the protection chip U1 rapidly controls the charging protection execution end CHG to output a low level so as to close the first switch tube Q1, thereby realizing the function of high-temperature protection. When the resistance detection end TS detects that the resistance value of the thermistor RT1 is greater than 27.965K ohms, it indicates that the temperature of the battery cell B is lower than 0 degree, and the protection chip U1 rapidly controls the charging protection execution end CHG to output a low level so that the first switch tube Q1 is closed, thereby realizing the function of low-temperature protection. The detection results of the above-mentioned high-temperature protection and low-temperature protection can be reported to the microprocessor via the communication port 20 so as to realize an active temperature control function.

In addition, during the discharging process, the temperature of the battery cell B will rise. When the resistance detection end TS detects that the resistance value of the thermistor RT1 is less than 3.0072K ohms, it indicates that the temperature of the battery cell B is greater than 60 degrees, and the protection chip U1 rapidly controls the discharging protection execution end DSG to output a low level so as to close the second switch tube Q2, thereby realizing the function of high-temperature protection. When the resistance detection end TS detects that the resistance value of the thermistor RT1 is greater than 72.8183K ohms, it indicates that the temperature of the battery cell B is lower than −20 degrees, and the protection chip U1 rapidly controls the discharging protection execution end DSG to output a low level so that the second switch tube Q2 is closed, thereby realizing the function of low-temperature protection. The detection results of the above-mentioned high-temperature protection and low-temperature protection can be reported to the microprocessor via the communication port 20 so as to realize an active temperature control function.

In some embodiments, with continued reference to FIG. 3, the battery 100 further includes a second resistor R2 and a second capacitor C2, the second resistor being a current limiting resistor connected between the positive electrode of the battery cell B and the positive electrode voltage end VDD. One end of the second capacitor C2 is a filter capacitor connected to the link between the second resistor R2 and the positive electrode voltage end VDD.

With continued reference to FIG. 3, the battery 100 further includes a third resistor R3, a fourth resistor R4, a fifth resistor R5, a sixth resistor R6, a seventh resistor R7, and an eighth resistor R8. The third resistor R3 is connected between the charging protection execution end CHG and the gate of the first switch tube Q1, and the fourth resistor R4 is connected between the gate of the first switch tube Q1 and the source electrode of the first switch tube Q1; the fifth resistor R5 is connected between the discharging protection execution end DSG and the gate of the second switch tube Q2, and the sixth resistor R6 is connected between the gate of the second switch tube Q2 and the source electrode of the second switch tube Q2; one end of the seventh resistor R7 is connected to the charged power detection end SRP, and the other end is connected between the negative electrode of the battery cell B and the link of the first resistor R1; one end of the eighth resistor R8 is connected to the discharged power detection end SRN, and the other end is connected between the negative electrode port P− and the link of the first resistor R1. The third resistor R3, fourth resistor R4, fifth resistor R5, sixth resistor R6, seventh resistor R7, and eighth resistor R8 are all divider resistances. The resistance values of the third resistor R3 and the fifth resistor R5 are 5.1 k ohms, the resistance values of the fourth resistor R4 and the sixth resistor R6 are 10M ohms, and the resistance values of the seventh resistor R7 and the eighth resistor R8 are 100 ohms.

With continued reference to FIG. 3, the battery 100 further includes a third capacitor C3, a fourth capacitor C4, a fifth capacitor C5, and a sixth capacitor C6. After the third capacitor C3 and the fourth capacitor C4 are connected in series, they are connected between the source electrode of the first switch tube Q1 and the source electrode of the second switch tube Q2. After the fifth capacitor C5 and the sixth capacitor C6 are connected in series, they are connected between the positive electrode interface P+ and the negative electrode interface P−. These two sets of capacitors connected in series being respectively arranged can enhance the voltage withstand capability of the capacitor and prevent the capacitor from breaking down the short circuit due to overvoltage which causes the battery cell to burn out due to large current. The capacitance values of the third capacitor C3, the fourth capacitor C4, the fifth capacitor C5, and the sixth capacitor C6 are all 0.1 microfarads.

In an embodiment of the present application, the preset current is 6A. Referring to FIG. 3 together, the battery 100 further includes a ninth resistor R9. One end of the ninth resistor R9 is connected to the current detection end PACK, and the other end is connected to a link between the switching circuit 110 and the positive electrode interface P+; the current detection end PACK of the protection chip U1 detects the passing current via the ninth resistor R9; when the detected charging current is greater than 6A, the protection chip U1 outputs a low level via the charging protection execution end CHG, and controls the first switch tube Q1 to switch off, so as to cut off a charging loop so that the charger cannot charge the battery cell B, thereby playing the role of charging protection. At this time, the battery can discharge the external load through the body diode due to the presence of the body diode of the first switch tube Q1. When the protection chip U1 detects that the battery voltage is lower than 4.2V, the charging protection execution end CHG outputs a high level, the first switch tube Q1 returns to the conductive state again, and the charger can charge the battery again. The overcharge protection time is very short, usually set within 2 s to avoid misjudgment due to interference.

Furthermore, when the discharging current passes through the first switch tube Q1 and the second switch tube Q2 connected in series during the normal load discharging of the battery cell B, one voltage drop is generated at both ends due to the internal resistance of the channel of the MOS tube. When the voltage drop detected by the current detection end PACK of the protection chip U1 is greater than 0.1V, it indicates that the loop current is too large, and the discharging protection execution end DSG outputs a low level to switch off the second switch tube Q2, thereby cutting off the discharging loop and realizing the function of over-current protection. The time for detecting discharging over-current is very short, usually set within 2 s to avoid misjudgment due to interference.

Furthermore, in the process of load discharging by the battery cell B, if the loop current is so large that the voltage drop detected by the current detection end PACK is greater than 0.9V, it indicates a short circuit of the load, and the protection chip U1 rapidly controls the discharging protection execution end DSG to output a low level to switch off the second switch tube Q2 so as to realize the function of short circuit protection. The time for short circuit detection is very short, usually set within 1 ms to avoid misjudgment due to interference.

Figure 4:
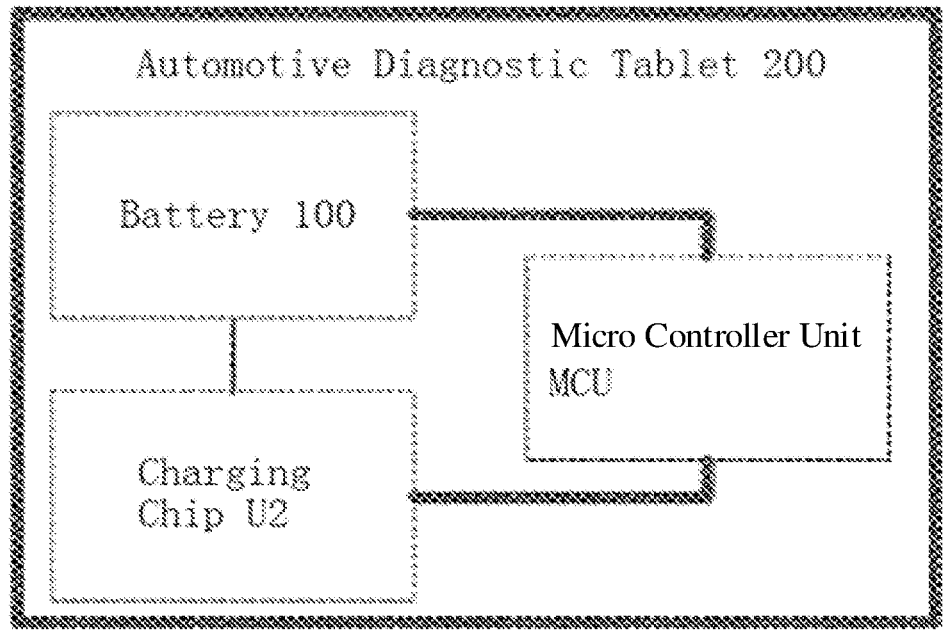
FIG. 4 is a block diagram showing a structure of an automotive diagnostic tablet according to an embodiment of the present application.

An embodiment of the present application also provides an automotive diagnostic tablet. Referring to FIG. 4, there is shown a block diagram of the structure of an automotive diagnostic tablet 200, including a micro controller unit (MCU), a charging chip U2, and a battery 100 as described above from FIG. 1 to FIG. 3 and in related embodiments.

The MCU is communicatively connected to the charging chip U2 and the communication interface 20 of the battery 100 respectively. The charging chip U2 is electrically connected to the battery 100, the charging chip U2 can be used for controlling the charging and discharging of the battery 100, and the MCU can perform data interaction with the charging chip U2 and the battery 100 respectively. In an embodiment of the present application, the MCU is communicatively connected to the charging chip U2 and the battery 100 through an I2C bus, respectively.

An embodiment of the present application provides a battery that has application in automotive diagnostic tablets. The battery comprises a battery cell, a positive electrode interface, and a negative electrode interface, the positive electrode of the battery cell being connected to the positive electrode interface. The battery also comprises a first resistor and a protection chip. One end of the first resistor is connected to the negative electrode of the battery cell, and the other end of the first resistor is connected to the negative electrode interface. The protection chip comprises a power detection end and a communication interface, and the power detection end is connected to the first resistor. The protection chip is used to detect the power information of the battery cell by means of the power detection end, and the power information is sent by means of the communication interface to a microprocessor. The battery according to the embodiment of the present application combines the functions of power detection and battery cell protection, and, by means of a protection chip, is capable of directly detecting the power state of a battery cell with small detection errors.

It should be noted that the device embodiments described above are merely schematic, wherein the units illustrated as separate parts may or may not be physically separated, and the parts shown as units may or may not be physical units, i.e. may be located in one place, or may also be distributed over multiple network units. Some or all modules may be selected to achieve the object of the embodiments and solutions according to actual needs.

Finally, it should be noted that: the above embodiments are merely illustrative of the technical solutions of the present application, rather than limiting thereto; combinations of technical features in the above embodiments or in different embodiments are also possible within the idea of the present application, and the steps can be implemented in any order, and there are many other variations of the different aspects of the present application as described above, which are not provided in detail for the sake of brevity; although the present application has been described in detail with reference to the foregoing embodiments, those of ordinary skills in the art will appreciate that: the technical solutions disclosed in the above-mentioned embodiments can still be modified, or some of the technical features can be replaced by equivalents; such modifications and substitutions do not depart the essence of corresponding technical solutions from the scope of the technical solutions of various embodiments of the present application.

The invention claimed is:

1. A battery, comprising a battery cell, a negative electrode interface, and a positive electrode interface, the positive electrode of the battery cell being connected to the positive electrode interface, wherein the battery further comprises:
   a first resistor, wherein one end of the first resistor is connected to the negative electrode of the battery cell, and the other end of the first resistor is connected to the negative electrode interface;
   a thermistor:
   a switching circuit; and
   a protection chip comprising a power detection end, a resistance detection end, a positive electrode voltage end, a negative electrode voltage end, and an execution end, a current detection end, and a communication interface, wherein
   the power detection end is connected to the first resistor, and
   the protection chip is configured to detect power information of the battery cell via the power detection end, and send the power information to a microprocessor via the communication interface, and
   the resistance detection end is connected to the thermistor, and
   the protection chip is configured to detect a resistance value of the thermistor in the battery cell via the resistance detection end, and control the switching circuit to switch off when a detected resistance value is not within a preset resistance value range, and
   an input end of the switching circuit is connected to the positive electrode of the battery cell, and an output end of the switching circuit is connected to the positive electrode interface, and
   the execution end of the protection chip is connected to a control end of the switching circuit, the positive electrode voltage end and the negative electrode voltage end are respectively connected to the positive electrode of the battery cell and the negative electrode of the battery cell,
   when it is detected that a voltage of the battery cell is higher than a first preset voltage, the protection chip controls the switching circuit to be in a first state via the execution end, wherein when the switching circuit is in the first state, current of the the switching circuit does not flow from the positive electrode interface to the battery cell, but the current of the switching circuit flows from the battery cell to the positive electrode interface,
   when it is detected that the voltage of the battery cell is lower than a second preset voltage, the protection chip controls the switching circuit to be in a second state via the execution end, wherein when the switching circuit is in the second state, the current of the switching circuit flows from the positive electrode interface to the battery cell, but the current of the switching circuit does not flow from the battery cell to the positive electrode interface, and
   the current detection end is connected to a link between the switching circuit and the positive electrode interface, and
   the protection chip is configured to control the switching circuit to be in the second state via the execution end when the current detection end detects that the current of the switching circuit is greater than a preset current.

2. The battery according to claim 1, wherein the switching circuit comprises a first switch tube and a second switch tube, a source electrode of the first switch tube is connected to the positive electrode of the battery cell, a drain electrode of the first switch tube is connected to the drain electrode of the second switch tube, the source electrode of the second switch tube is connected to the positive electrode interface, the first switch tube and the second switch tube both have a body diode, the body diode of the first switch tube enables the current of the switching circuit to flow from the battery cell in a direction of the positive electrode interface, and the body diode of the second switch tube enables the current of the switching circuit to flow from the positive electrode interface in the direction of the battery cell;
   the execution end of the protection chip comprises a charging protection execution end and a discharging protection execution end, the charging protection execution end being connected to a gate of the first switch tube, and the discharging protection execution end being connected to the gate of the second switch tube.

3. The battery according to claim 2, wherein both the first switch tube and the second switch tube are N-metal oxide semiconductor (NMOS) tubes.

4. The battery according to claim 1, wherein the power detection end comprises a charged power detection end and a discharged power detection end;
   the charged power detection end is connected to the negative electrode of the battery cell and a link of the first resistor, and the discharged power detection end is connected to the first resistor and the link of the negative electrode interface.

5. The battery according to claim 4, wherein the battery further comprises a first capacitor in parallel with the first resistor.

6. The battery according to claim 1, wherein the communication interface is an inter integrated circuit (I2C) interface.

7. An automotive diagnostic tablet, comprising a micro controller unit (MCU), a charging chip, and a battery, wherein the MCU is communicatively connected to the charging chip and the communication interface of the battery respectively, and the charging chip is electrically connected to the battery;
   wherein the battery comprises a battery cell, a negative electrode interface and a positive electrode interface, the positive electrode of the battery cell being connected to the positive electrode interface, and the battery further comprises:
a first resistor, wherein one end of the first resistor is connected to the negative electrode of the battery cell, and the other end of the first resistor is connected to the negative electrode interface;
a thermistor;
a switching circuit; and
a protection chip comprising a power detection end, a resistance detection end, a positive electrode voltage end, a negative electrode voltage end, and an execution end, a current detection end and a communication interface, wherein
the power detection end is connected to the first resistor, and
the protection chip is configured to detect power information of the battery cell via the power detection end, and send the power information to a microprocessor via the communication interface, and
the resistance detection end is connected to the thermistor, and
the protection chip is configured to detect a resistance value of the thermistor in the battery cell via the resistance detection end, and control the switching circuit to switch off when a detected resistance value is not within a preset resistance value range, and
an input end of the switching circuit is connected to the positive electrode of the battery cell, and an output end of the switching circuit is connected to the positive electrode interface, and
the execution end of the protection chip is connected to a control end of the switching circuit, the positive electrode voltage end and the negative electrode voltage end are respectively connected to the positive electrode of the battery cell and the negative electrode of the battery cell,
when it is detected that a voltage of the battery cell is higher than a first preset voltage, the protection chip controls the switching circuit to be in a first state via the execution end, wherein when the switching circuit is in the first state, current of the the switching circuit does not flow from the positive electrode interface to the battery cell, but the current of the switching circuit flows from the battery cell to the positive electrode interface,
when it is detected that the voltage of the battery cell is lower than a second preset voltage, the protection chip controls the switching circuit to be in a second state via the execution end, wherein when the switching circuit is in the second state, the current of the switching circuit flows from the positive electrode interface to the battery cell, but the current of the switching circuit does not flow from the battery cell to the positive electrode interface, and
the current detection end is connected to a link between the switching circuit and the positive electrode interface, and
the protection chip is configured to control the switching circuit to be in the second state via the execution end when the current detection end detects that the current of the switching circuit is greater than a preset current.

8. The automotive diagnostic tablet according to claim 7, wherein the switching circuit comprises a first switch tube and a second switch tube, a source electrode of the first switch tube is connected to the positive electrode of the battery cell, a drain electrode of the first switch tube is connected to the drain electrode of the second switch tube, the source electrode of the second switch tube is connected to the positive electrode interface, the first switch tube and the second switch tube both have a body diode, the body diode of the first switch tube enables the current of the switching circuit to flow from the battery cell in a direction of the positive electrode interface, and the body diode of the second switch tube enables the current of the switching circuit to flow from the positive electrode interface in the direction of the battery cell;
the execution end of the protection chip comprises a charging protection execution end and a discharging protection execution end, the charging protection execution end being connected to a gate of the first switch tube, and the discharging protection execution end being connected to the gate of the second switch tube.

9. The automotive diagnostic tablet according to claim 8, wherein both the first switch tube and the second switch tube are N-metal oxide semiconductor (NMOS) tubes.

10. The automotive diagnostic tablet according to claim 7, wherein the power detection end comprises a charged power detection end and a discharged power detection end;
the charged power detection end is connected to the negative electrode of the battery cell and a link of the first resistor, and the discharged power detection end is connected to the first resistor and the link of the negative electrode interface.

11. The automotive diagnostic tablet according to claim 10, wherein the battery further comprises a first capacitor in parallel with the first resistor.

12. The automotive diagnostic tablet according to claim 7, wherein the communication interface is an inter integrated circuit (I2C) interface.

* * * * *